(12) United States Patent
Roohparvar

(10) Patent No.: US 7,336,531 B2
(45) Date of Patent: Feb. 26, 2008

(54) MULTIPLE LEVEL CELL MEMORY DEVICE WITH SINGLE BIT PER CELL, RE-MAPPABLE MEMORY BLOCK

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 246 days.

(21) Appl. No.: 10/877,420

(22) Filed: Jun. 25, 2004

(65) Prior Publication Data

US 2005/0286297 A1    Dec. 29, 2005

(51) Int. Cl.
*G11C 16/04* (2006.01)

(52) U.S. Cl. ............... 365/185.03; 365/185.11; 365/185.17

(58) Field of Classification Search ......... 365/185.03, 365/185.11, 185.17
See application file for complete search history.

(56) References Cited

U.S. PATENT DOCUMENTS

| | | | |
|---|---|---|---|
| 5,541,886 A * | 7/1996 | Hasbun | 365/185.03 |
| 5,877,986 A | 3/1999 | Harari | |
| 5,937,423 A * | 8/1999 | Robinson | 711/103 |
| 6,067,248 A * | 5/2000 | Yoo | 365/185.03 |
| 6,414,876 B1 | 7/2002 | Harari | |
| 6,462,992 B2 | 10/2002 | Harari | |
| 6,493,260 B2 * | 12/2002 | Micheloni et al. | 365/185.03 |
| 6,519,185 B2 | 2/2003 | Harari | |
| 6,523,132 B1 | 2/2003 | Harari | |

* cited by examiner

*Primary Examiner*—Huan Hoang
(74) *Attorney, Agent, or Firm*—Leffert, Jay & Polglaze P.A.

(57) ABSTRACT

A non-volatile memory device has a plurality of memory cells that are organized into memory blocks. Each block can operate in either a multiple level cell mode or a single bit per cell mode. One dedicated memory block is capable of operating only in the single bit per cell mode. If the dedicated memory block is found to be defective, a defect-free block can be remapped to that dedicated memory block location to act only in the single bit per cell mode.

22 Claims, 5 Drawing Sheets

MULTIPLE LEVEL CELL MEMORY DEVICE WITH SINGLE BIT PER CELL, RE-MAPPABLE MEMORY BLOCK

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

The present trend of electronic devices is increased performance at reduced cost. The component manufacturers, therefore, must continue to increase the performance of their devices while decreasing the cost to manufacture them.

One way to increase a flash memory device's density while lowering its manufacturing cost is to use multiple level cells (MLC). Such a device stores two logical bits per physical cell. This reduces the overall cost of the memory. NAND flash memory devices are designed to operate in either one of two configurations on the same die: single bit per cell (SBC) or MLC. The selection of the configuration is done at the factory when the die is manufactured through a metal mask or a programmable fuse option.

However, an MLC die, while having improved cost versus density, has drawbacks relative to performance. Both the programming and read operations can become slower for an MLC die. Therefore, the user typically has to choose between having high memory density at low cost and lower memory density with higher performance. Additionally, due to the smaller margins from one state to another state in an MLC die, any loss in charge from the floating gate can cause the stored data to become corrupted.

For the reasons stated above, and for other reasons stated below which will become apparent to those skilled in the art upon reading and understanding the present specification, there is a need in the art for a memory device that combines the attributes of MLC with the reliability of SBC devices in at least a portion of the memory.

SUMMARY

The above-mentioned problems with reliability and other problems are addressed by the present invention and will be understood by reading and studying the following specification.

The embodiments of the present invention encompass a non-volatile memory device that is organized into a plurality of memory blocks. Each memory block is adapted to operate in either a multiple level cell mode or a single bit per cell mode. A dedicated memory block is adapted to operate only in the single bit per cell mode. This block can be used to store boot code or other important data that needs to have the higher reliability of the SBC configuration.

Further embodiments of the invention include methods and apparatus of varying scope.

DETAILED DESCRIPTION

Figure 1:
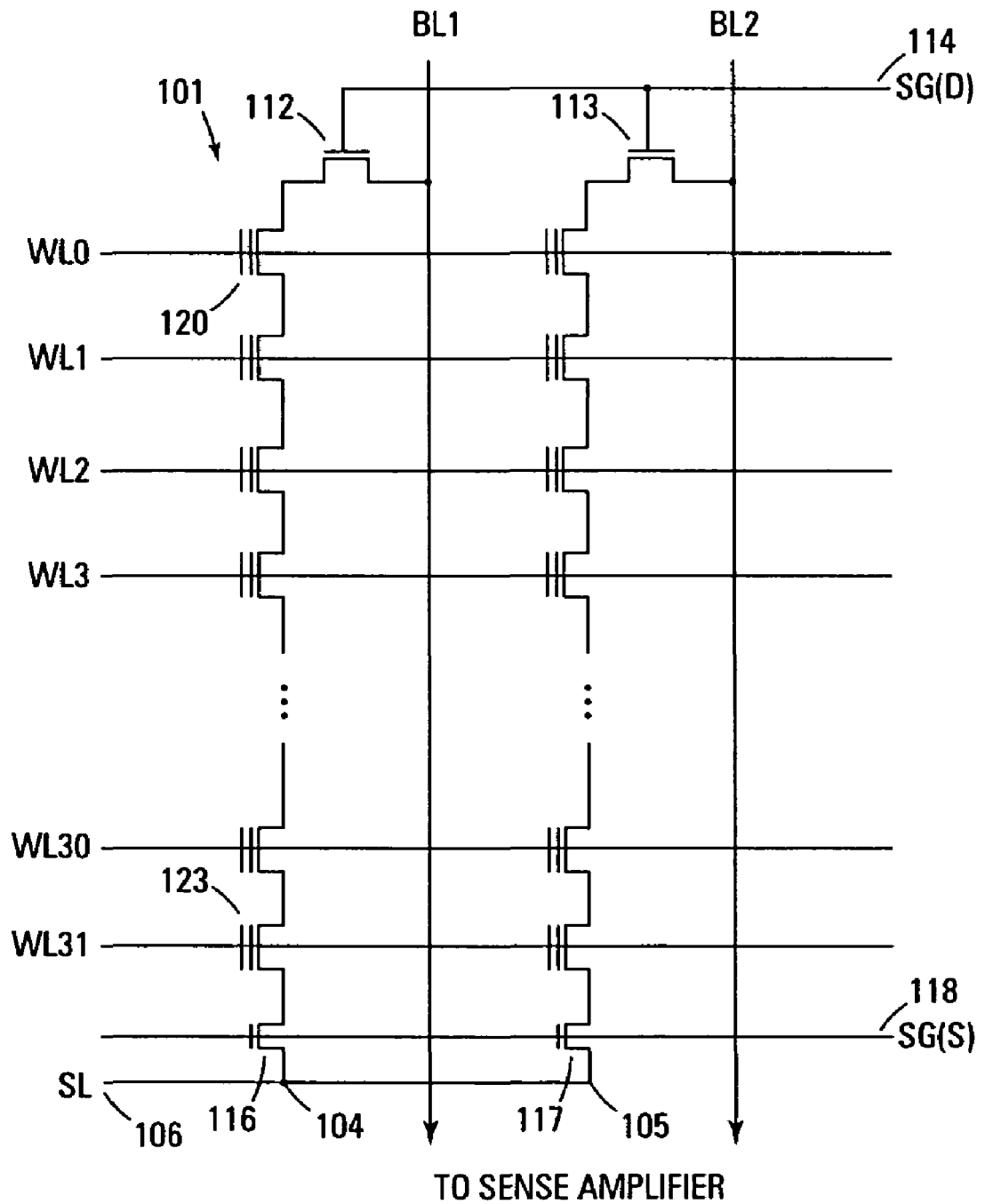
FIG. 1 shows a diagram of one embodiment of a NAND flash memory array of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a NAND flash array is comprised of an array of floating gate cells 101 arranged in series strings 104, 105. Each of the floating gate cells are coupled drain to source in the series chain 104, 105. Word lines (WL0-WL31) that span across multiple series strings 104, 105 are coupled to the control gates of every floating gate cell in order to control their operation. The memory array is arranged in row and column form such that the word lines (WL0-WL31) form the rows and the bit lines (BL1-BL2) form the columns.

In operation, the word lines (WL0-WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1-BL2) by a drain select gate 112, 113. The source select gates 116, 117 are controlled by a source select gate control line SG(S) 118 coupled to their control gates. The drain select gates 112, 113 are controlled by a drain select gate control line SG(D) 114.

The memory cells illustrated in FIG. 1 can be operated as either single bit cells (SBC) or multilevel cells (MLC). Multilevel cells greatly increase the density of a flash memory device. Such cells enable storage of multiple bits per memory cell by charging the floating gate of the transistor to different levels. MLC technology takes advantage of the analog nature of a traditional flash cell by assigning a bit pattern to a specific voltage range stored on the cell. This technology permits the storage of two or more bits per cell, depending on the quantity of voltage ranges assigned to the cell.

For example, a cell may be assigned four different voltage ranges of 200 mV for each range. Typically, a dead space or guard band of 0.2V to 0.4V is between each range. If the voltage stored on the cell is within the first range, the cell is storing a 00. If the voltage is within the second range, the cell is storing a 01. This continues for as many ranges are used for the cell.

The embodiments of the present invention may refer to the MLC as a high density configuration. In one embodiment of the present invention, the memory density is two bits per cell. However, some embodiments may store more than two bits per cell, depending on the quantity of different voltage ranges that can be differentiated on the cell. Therefore, the term high density generally refers to any density beyond single bit cells.

Figure 2:
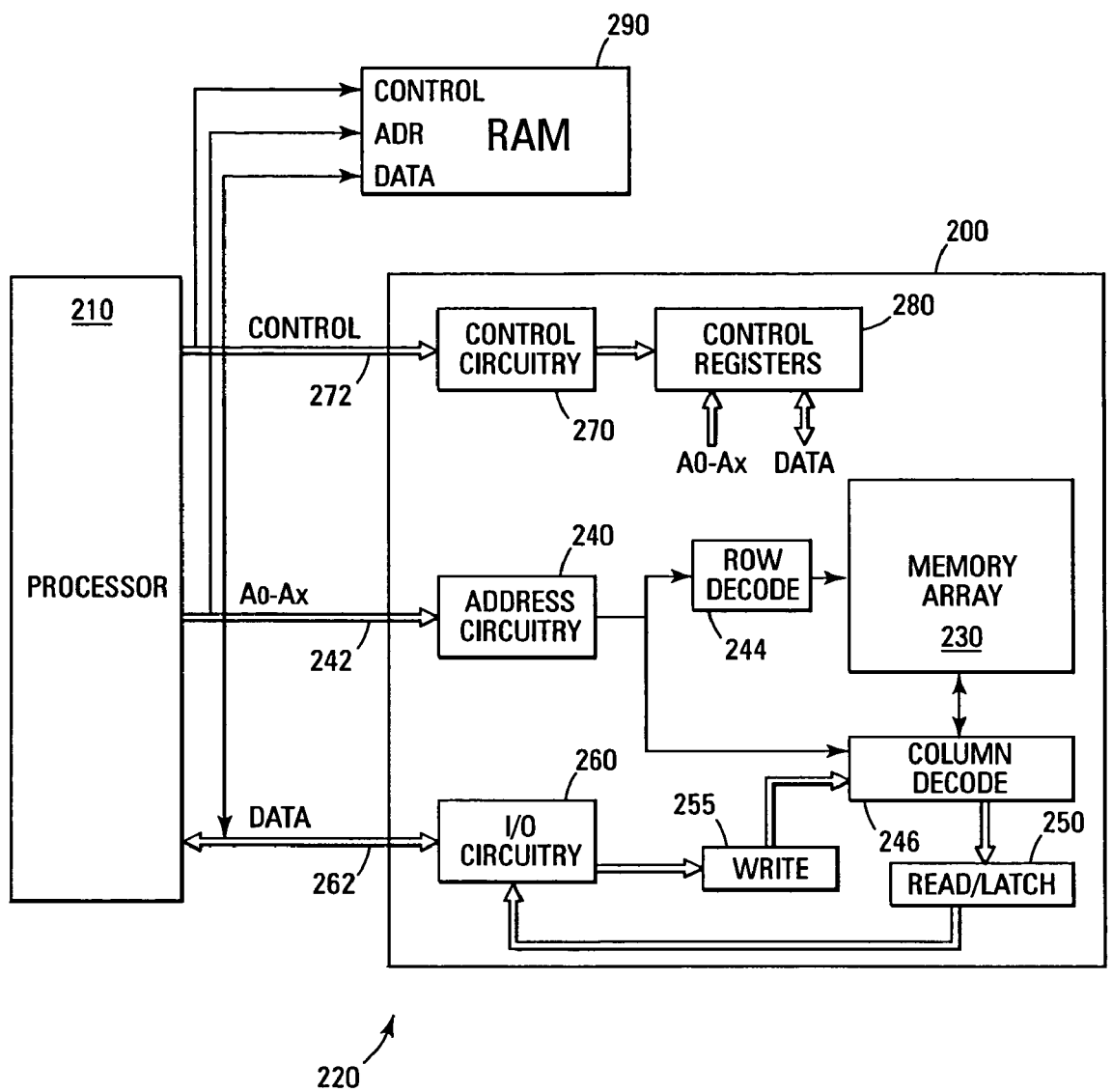
FIG. 2 shows a block diagram of one embodiment of a flash memory system of the present invention that incorporates the memory array of FIG. 1.

FIG. 2 illustrates a block diagram of one embodiment of a flash memory system 220 of the present invention that incorporates the memory array illustrated in FIG. 1. The memory device 200 has been simplified to focus on features of the memory that are helpful in understanding the present invention. A more detailed understanding of internal circuitry and functions of flash memories are known to those skilled in the art.

A processor 210 controls the operation of the flash memory system. The processor 210 may be a microprocessor, a microcontroller, or some other type of control circuitry that generates the memory control, data, and address signals required by the memory device 200.

The memory device 200 includes an array of flash memory cells 230 as discussed previously. An address buffer circuit 240 is provided to latch address signals provided on address input connections A0-Ax 242. Address signals are received and decoded by a row decoder 244 and a column decoder 246 to access the memory array 230. It will be appreciated by those skilled in the art, with the benefit of the present description, that the number of address input connections depends on the density and architecture of the memory array 230. That is, the number of addresses increases with both increased memory cell counts and increased bank and block counts.

The memory device 200 reads data in the memory array 230 by sensing voltage or current changes in the memory array columns using sense amplifier/buffer circuitry 250. The sense amplifier/buffer circuitry, in one embodiment, is coupled to read and latch a row of data from the memory array 230. Data input and output buffer circuitry 260 is included for bi-directional data communication over a plurality of data connections 262 with the controller 210. Write circuitry 255 is provided to write data to the memory array.

Control circuitry 270 decodes signals provided on a control bus 272. These signals are used to control the operations on the memory array 230, including data read, data write, and erase operations. The control circuitry 270 may be a state machine, a sequencer, or some other type of controller. The control circuitry 270, in one embodiment, is responsible for executing the embodiments of the methods of the present invention for configuring the memory blocks as high or single density. The control circuitry 270 may also be responsible for control of the memory block remapping embodiments of the present invention.

The control circuitry 270 can also program the configuration registers 280 in which, in one embodiment, the high/single density memory configuration bits of the present invention can reside. This register may be a non-volatile, programmable fuse apparatus, a volatile memory array, or both. The configuration register 280 can also hold other data such as trimming data, memory block lock data, record keeping data for the memory device, and other data required for operation of the memory device.

In one embodiment, random access memory (RAM) 290 is included in the system 220 for volatile storage of data. The RAM 290 might be used to store memory density configuration data that is read from the non-volatile memory array 230 during initialization. In an embodiment where the system 220 is a memory card, the RAM 290 might be included on the card or coupled to the card through a back plane or other bus transmission structure.

One requirement of such a memory system as illustrated in FIG. 2 is that at least one block should be error free. In one embodiment, this block is memory block 0. This is the block that is normally used to store the system's BIOS (boot code) or other critical data such as bad block addresses. This is a popular mode of operation in which the data from block 0 is automatically loaded into RAM at power up in order to begin execution and loading of the operating system.

If either the entire memory array 230 or block 0 of the system 220 of FIG. 2 were selected to operate in the MLC mode, this could impact the reliability of block 0. This is due to the problems stated above and also that, during power-up of the system, the power supplies are not stable and the noise generated at power-up may cause problems with the smaller $V_T$ margins used in the MLC mode.

Since the SBC mode operates with wider $V_T$ margins, it is a more reliable mode of operation. Therefore, to increase the reliability of block 0, it is permanently designated as operating in the SBC mode independent of the mode selected for any other blocks of the array 230. Such a designation is transparent to the end user.

The embodiments of the present invention are not limited to only block 0 being permanently designated as operating in the SBC mode. If an application required different blocks or blocks in addition to block 0 to have wider margins, these blocks can also be permanently designated as SBC blocks independent of the remainder of the memory array.

Even in the SBC mode, block 0, or other SBC memory block, may still have one or more defective cells from the manufacturing process. If the SBC mode block is determined to have, in one embodiment, at least one defect, an error free block is mapped to the SBC mode block. This has the benefit of potentially increasing memory part yield since the part does not have to be thrown out due to a defect in the SBC mode block.

Figure 3:
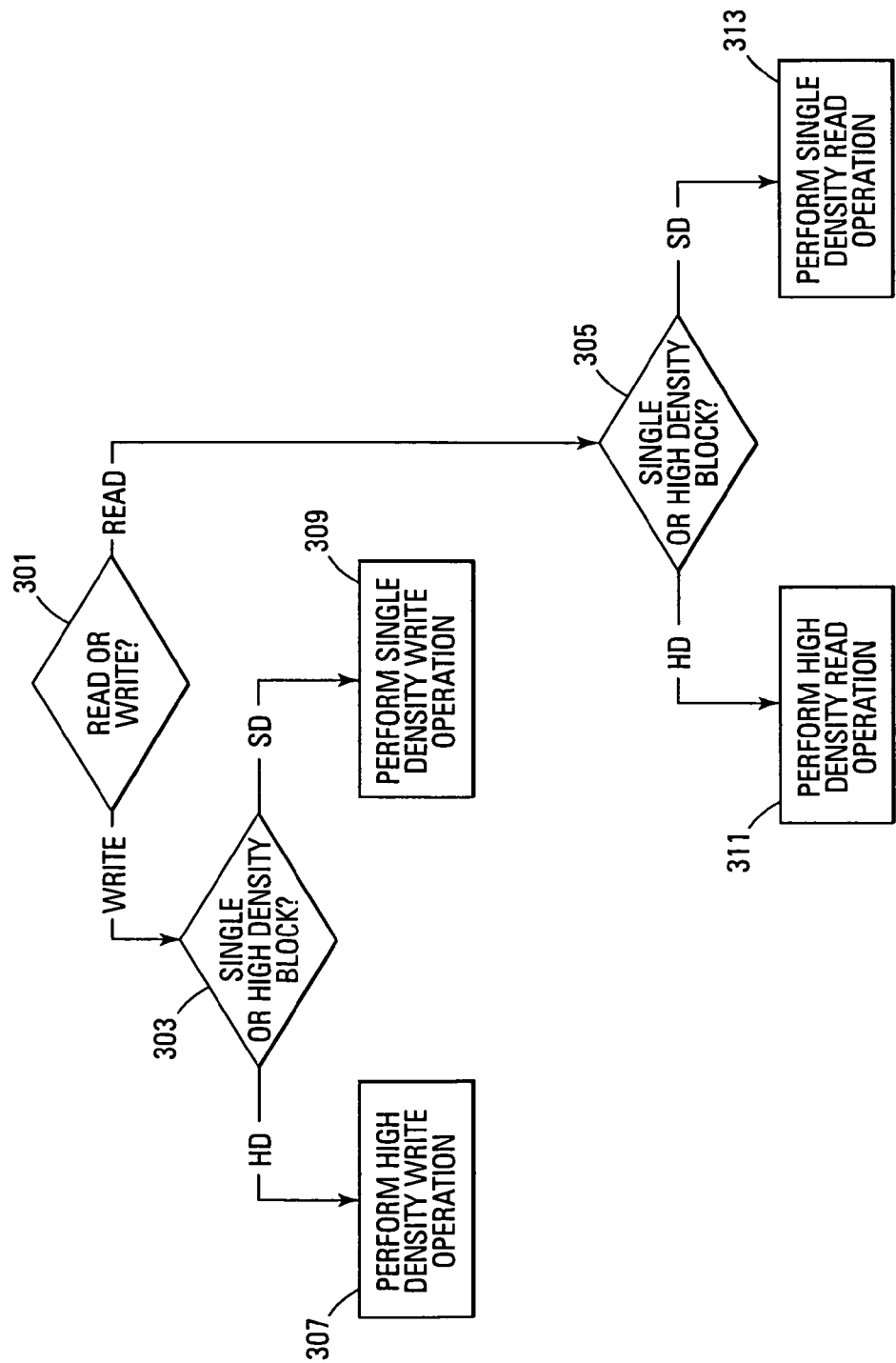
FIG. 3 shows a flowchart of one embodiment of a method for configuring the density/performance of a memory device.

FIG. 3 illustrates a flowchart of one embodiment of a method for configuring the density/performance of a memory device. This embodiment uses special write and read commands to perform high density program and read operations. This embodiment puts the burden on the memory control circuitry to determine the density/performance configuration for a particular memory block. By having the control circuitry perform this task, the memory device does not require any extra hardware in order to switch blocks between high density and single density. The controller tracks the density/performance level.

This embodiment uses two sets of algorithms—one for SBC reading and writing and another for MLC reading and writing. A higher level routine determines which set of algorithms to use depending on the received command. In this embodiment, the erase operation is substantially similar for each memory density.

The method determines if the received command is a read or write command 301. If a write command was received, it is determined 303 whether the command is a single density write command or a special high density write command. A high density write command 307 causes the controller circuitry to program the specified memory block with two or more bits per cell. A single density write command 309 causes the controller circuitry to program the specified memory block with one bit per cell.

If the received command is a read command, it is determined 305 whether the command is a single density read command or a high density read command. If the command is a high density read command 311, the memory block was previously programmed as an MLC cell and is, therefore, read with a high density read operation. A single density configuration read command causes the memory block to be read 313 assuming it was programmed as an SBC.

Figure 4:
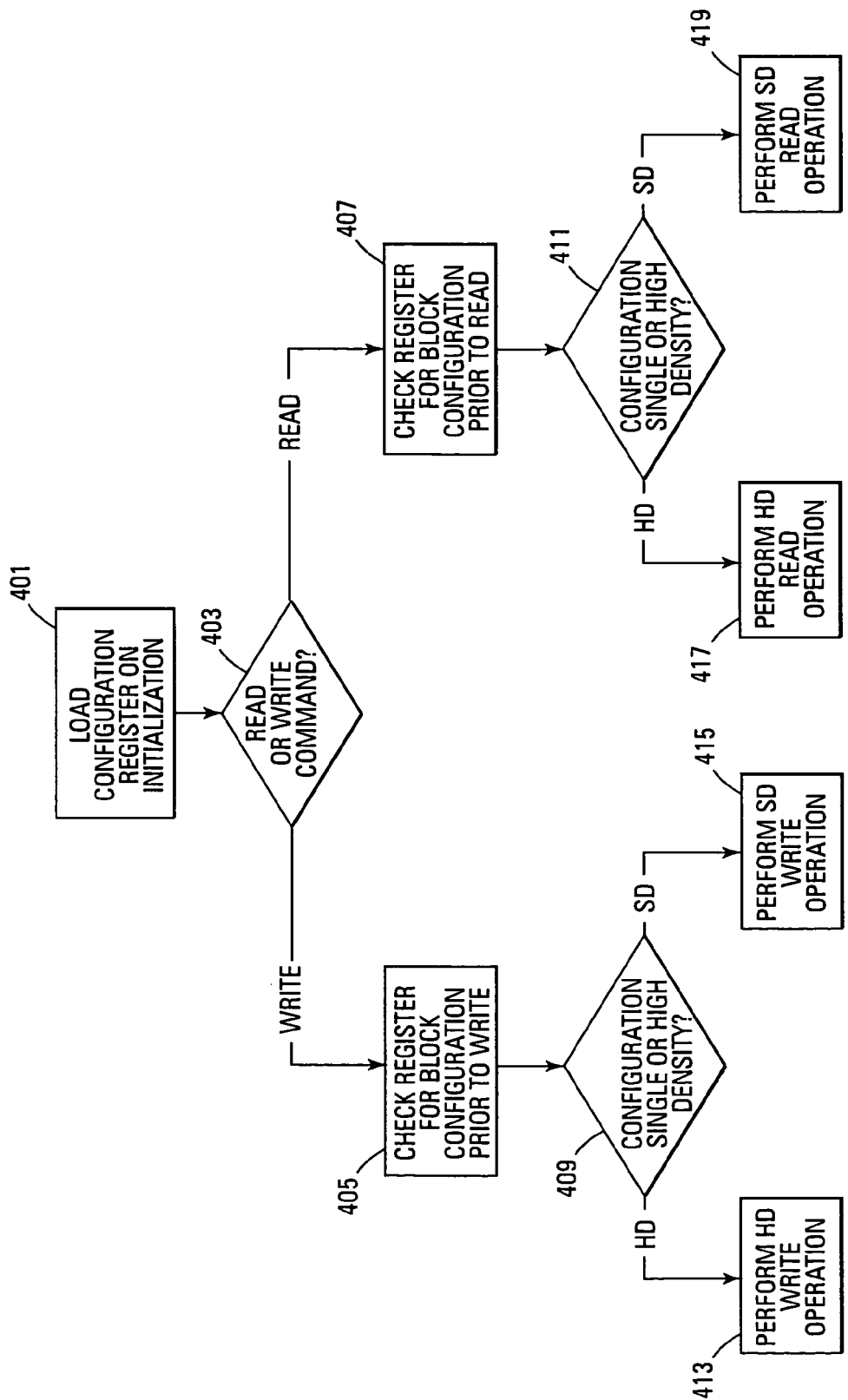
FIG. 4 shows a flowchart of another embodiment of a method for configuring the density/performance of a memory device.

In another embodiment of the present invention, illustrated in FIG. 4, a configuration register is used to pre-assign blocks of memory to the SBC or MLC configuration of operation. This could occur when the system is initialized. This embodiment would not require special commands than those used in MLC or SBC flash memory devices. Additionally, an existing register could be used to store the configuration data so that additional hardware is not required or, in another embodiment, a dedicated configuration register could be added to the memory device.

In one embodiment, the register of the present invention has a bit for every memory block for indicating the operating mode (e.g., MLC or SBC) of that particular block. For example, a logical 1 stored in the memory block 0 configuration bit would indicate that the block is an SBC block while a logical 0 would indicate the block is operating as an MLC block. In another embodiment, these logic levels are reversed.

Alternate embodiments can assign different quantities of blocks to each bit of the configuration register. For example, the register may have a configuration bit assigned to more than one memory block. Additionally, a configuration bit may be assigned to the sub-block level such that each block has multiple configuration bits.

In one embodiment, row 0 of the flash memory device of the present invention is a configuration row. At initialization and/or power-up of the device, the configuration data from row 0 is loaded into the configuration register 401.

When a command is received, it is determined whether it is a read or write command 403. For a read command, the configuration register is checked prior to the read operation to determine if the memory block has been assigned a high density or single density configuration 407. In a single density configuration 411, a single density read operation is performed 419. In a high density configuration 411, a high density read operation is performed 417.

If a write command was received, the configuration register is checked prior to write operation to determine if the memory block has been assigned a high density or a single density configuration 409. In a single density configuration 409, a single density write operation is performed 415. In a high density configuration 409, a high density write operation is performed 413.

In the embodiment of FIG. 4, the user determines the configuration of each block, or other memory cell grouping, and stores this data into the configuration register. When the memory device is powered down, the data in the configuration register is copied to row 0 for more permanent storage in non-volatile memory. In another embodiment, the user can store the configuration directly to the non-volatile, configuration row of the memory device.

Figure 5:
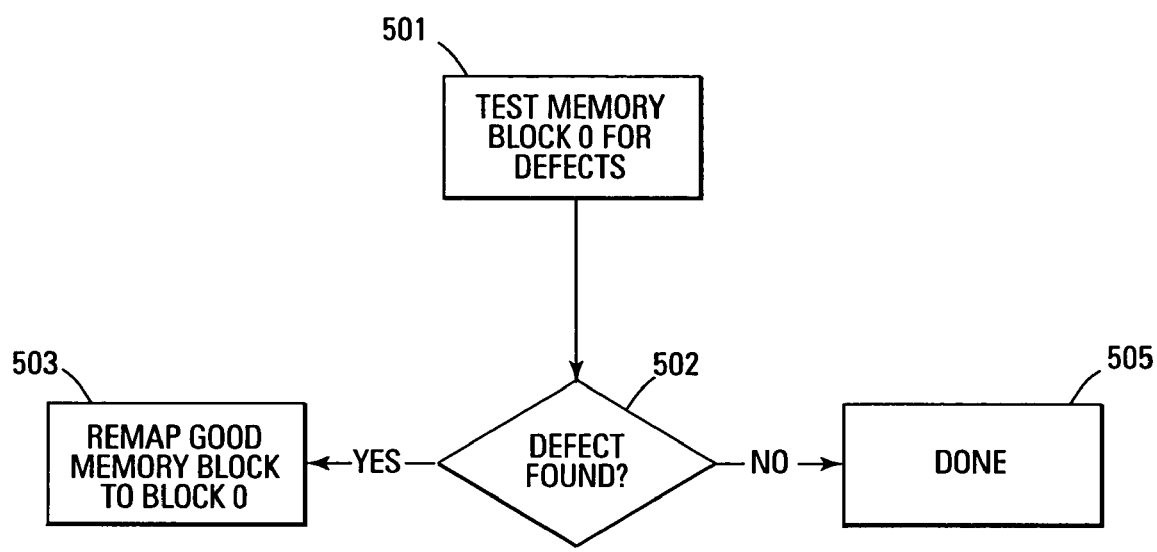
FIG. 5 shows a flow chart of one embodiment of a method for remapping a defect-free memory block to the dedicated SBC block of the present invention.

FIG. 5 illustrates a flow chart of one embodiment of a method for remapping a defect-free memory block to the SBC block of the present invention. For purposes of illustration, the method of FIG. 5 refers to block 0 as the SBC dedicated memory block. However, any block required by the system to be SBC mode only is covered by the methods of the present invention.

Memory block 0 is tested for defects 501. This can be accomplished during the manufacturing process or at another time. If a defect is not found 502, the method is done since block 0 is to remain the SBC mode only block.

If a defect is found in block 0 502, a defect-free memory block is remapped to block 0 503 to act as an SBC-only block. After the remapping has been performed, access to the defective block 0, during boot-up or other operations, is rerouted to the remapped memory block so that the remapping operation is transparent to the user.

The flash memory of the present invention is comprised of memory blocks that can each be configured to store data in different densities (except block 0 or other SBC-dedicated blocks). For example, one use of a single memory device might be to store both pictures and code. The picture data is more tolerant of corrupted data than the storage of code. Therefore, since the SBC configuration has a higher reliability than the MLC configuration, the user would typically choose the SBC configuration for the code storage and the MLC configuration for the picture storage.

Similarly, since the MLC configuration might be eight to nine times slower in read and programming performance as compared to the SBC configuration, the user might choose the SBC configuration for memory blocks requiring faster read/write times. This could be useful in a system having fast bus speeds requiring fast storage and retrieval times.

CONCLUSION

In summary, the embodiments of the present invention provide a flash memory device that has user selectable MLC/SBC memory blocks while maintaining a dedicated SBC mode block. Additionally, if the dedicated SBC mode block has been determined to have defects, another block can be remapped to the defective block's location and act as an SBC-only block.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A non-volatile memory device comprising:
   a memory array having a plurality of memory blocks comprising:
   a subset of the plurality of memory blocks wherein each memory block of the subset is adapted to operate in either a multiple level cell mode or a single bit per cell mode; and at least one dedicated error free memory block of the plurality of memory blocks that is adapted to operate only in the single bit per cell mode.

2. The device of claim 1 wherein the non-volatile memory device is a NAND flash memory device.

3. The device of claim 1 wherein the dedicated memory block is block 0 of the memory device.

4. The device of claim 1 wherein the dedicated memory block is adapted to store boot code.

5. The device of claim 1 wherein the dedicated memory block is adapted to store defective memory addresses.

6. The device of claim 1 wherein the multiple level cell mode comprises two bits stored on each cell of the block.

7. A flash memory device comprising:
a memory array comprising a plurality of memory cells organized into memory blocks including at least one dedicated error free memory block that operates only in a single density mode; and
control circuitry for controlling which memory blocks store data in a high density mode and which memory blocks store data in the single density mode.

8. The device of claim 7 and further including:
a control bus, coupled to the control circuitry, for accepting configuration commands; and
a control register that stores configuration bits in response to the control circuitry and the configuration commands.

9. The device of claim 7 wherein the control circuitry is further adapted to control remapping of a first of the memory blocks to the dedicated memory block such that further accesses to the dedicated memory block are performed by the first memory block.

10. The device of claim 7 and further including:
a control bus, coupled to the control circuitry, for accepting single density and high density read and write commands such that the control circuitry writes to and reads from the memory blocks in either the single density mode or the high density mode in response to the commands.

11. A flash memory device having a control bus, an address bus and a data bus, the device comprising:
a memory array comprising a plurality of memory cells organized into memory blocks including a first dedicated error free memory block that operates only in a single density configuration, the remaining memory blocks capable of operating in either the single density configuration or a high density configuration;
control circuitry, coupled to the control bus, for controlling which memory blocks store data in a high density configuration and which memory blocks store data in the single density configuration; and
control registers, coupled to the control circuitry, for storing configuration bits indicating the configuration of each of the memory blocks.

12. The device of claim 11 wherein the flash memory device is a NAND flash memory device.

13. The device of claim 11 wherein the control circuitry remaps access to the first dedicated memory block to a second dedicated memory block that operates only in the single density configuration.

14. A flash memory system comprising:
a processor for generating memory control signals; and
a flash memory device coupled to the processor and comprising:
a memory array having a plurality of memory blocks comprising:
a subset of the plurality of memory blocks that are each adapted to operate in either a multiple level cell configuration or a single bit per cell configuration; and
at least one dedicated error free memory block of the plurality of memory blocks that is adapted to operate only in the single bit per cell configuration.

15. The system of claim 14 wherein the flash memory device further includes control circuitry, coupled to the processor, for changing the configuration of each memory block in response to the memory control signals.

16. The system of claim 15 wherein the control circuitry further controls access to the dedicated memory block such that accesses to a defective memory block are remapped to the dedicated memory block.

17. A method for accessing a plurality of memory blocks in a flash memory device, the method comprising:
performing a single density read operation from a dedicated error free memory block of the plurality of memory blocks, the dedicated error free memory block operating only in a single density configuration;
performing a high density write operation to a first memory block of the plurality of memory blocks; and
performing a single density write operation to a second memory block of the plurality of memory blocks.

18. The method of claim 17 and further including:
performing a single density read operation from the second memory block; and
performing a high density read operation from the first memory block.

19. The method of claim 17 wherein performing a single density read operation from the dedicated memory block comprises remapping the read operation to an error free memory block that operates only in the single density configuration.

20. A method for accessing a plurality of memory blocks in a flash memory device that is part of a memory system having a processor, the method comprising:
performing a single density read operation from memory block 0 of the plurality of memory blocks, memory block 0 being error free and capable of operating only in a single density configuration;
performing a high density write operation to a first memory block of the plurality of memory blocks; and
performing a single density write operation to a second memory block of the plurality of memory blocks.

21. The method of claim 20 wherein memory block 0 contains boot code that is executable by the processor.

22. The method of claim 20 wherein memory block 0 contains addresses of bad memory blocks of the plurality of memory blocks.

\* \* \* \* \*